United States Patent [19]

Charles et al.

[11] 4,334,009

[45] Jun. 8, 1982

[54] PROCESS FOR MODIFYING TACKY SURFACES

[75] Inventors: Magalie M. Charles, Staten Island, N.Y.; Robert B. Heiart, Middletown, N.J.

[73] Assignee: E. I. Du Pont de Nemours and Company, Wilmington, Del.

[21] Appl. No.: 189,829

[22] Filed: Sep. 23, 1980

[51] Int. Cl.³ ............................ G03C 7/40; B05D 5/02
[52] U.S. Cl. .................................... 430/291; 430/950; 430/358; 430/496; 427/201
[58] Field of Search ...................... 430/291, 950, 496; 427/201

[56] References Cited

U.S. PATENT DOCUMENTS

| | | | |
|---|---|---|---|
| 3,909,282 | 9/1975 | Gray | 430/291 |
| 4,215,193 | 7/1980 | Manger et al. | 430/291 |
| 4,229,518 | 10/1980 | Gray et al. | 430/950 |

*Primary Examiner*—Richard L. Schilling
*Assistant Examiner*—John L. Goodrow

[57] ABSTRACT

Process for modifying tacky surfaces, e.g., tacky layer on a photograph or other photochemically produced record, which comprises applying an admixture of particulate material and carrier particles and removing the excess particulate material and carrier particles. The ratio of average particle diameter of the carrier particles to average particle diameter of the particulate material is greater than 2 and the weight ratio of particulate material to carrier particles is less than 1. The degree of surface modification, e.g., light reflectivity, etc., can be controlled by the process.

20 Claims, 1 Drawing Figure

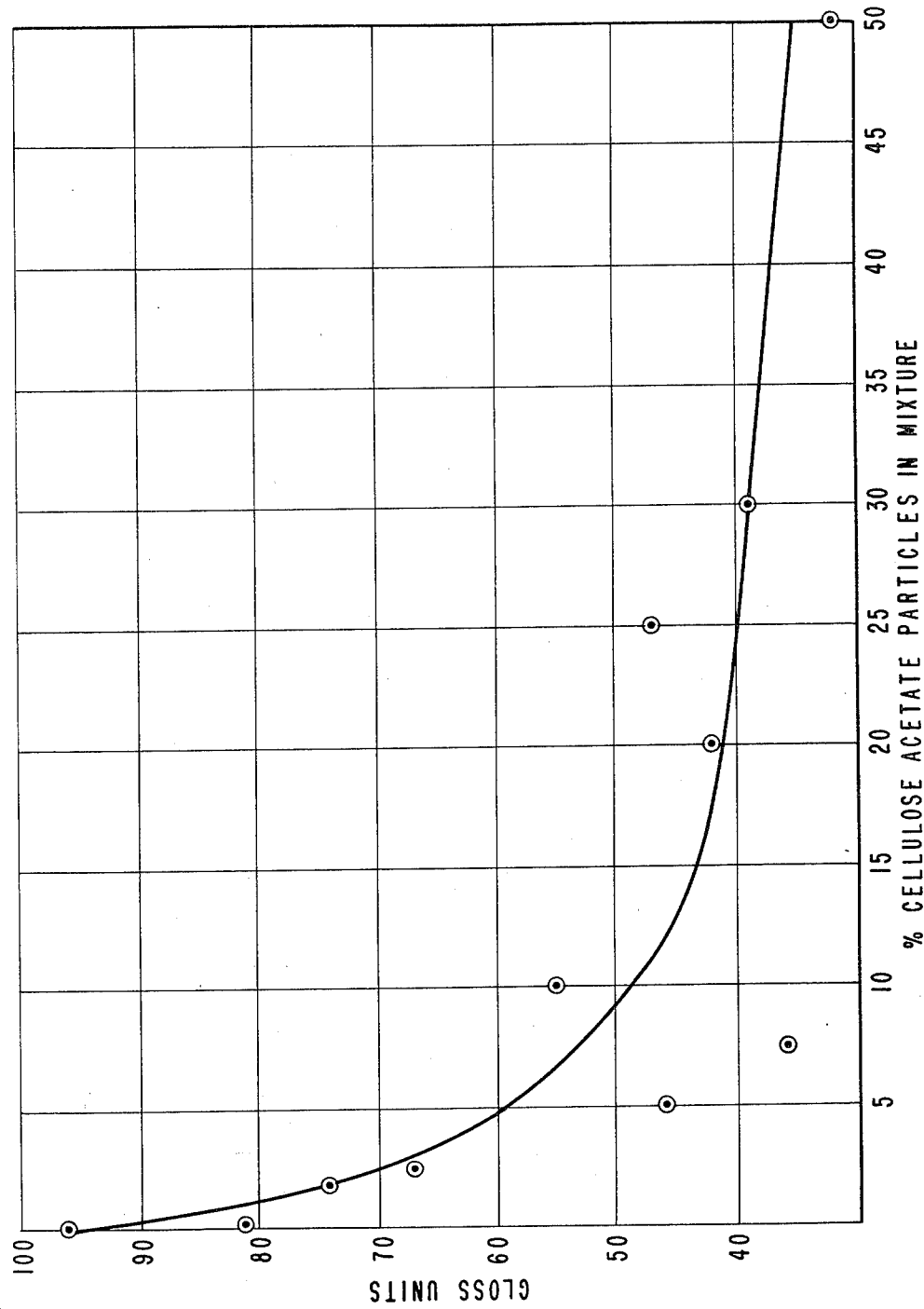

PROCESS FOR MODIFYING TACKY SURFACES

DESCRIPTION

1. Technical Field

This invention relates to a process for modifying a tacky surface. More particularly, this invention relates to the use of an admixture of particulate material and carrier particles to modify the tacky surface.

2. Background Art

Items or objects that people use or see in their daily lives range in appearance from high gloss to dull or flat. Highly glossy surfaces reflect a high proportion of the light directed at them specularly. In many instances it is desirable to modify light reflectivity to reduce high gloss or change other properties. For example, it is particularly desirable in the photoimaging and image reproduction industry to modify the light reflectivity of photosensitive materials which are useful as color proofs. The modification of the light reflectivity of the outer surface of a color proof results in a matte finish. Photosensitive materials used in colorproofing are of the positive- or negative-working types. A positive-working process is described in Chu and Cohen U.S. Pat. No. 3,649,268. Positive-working materials contain tacky photohardenable compositions which when exposed imagewise to actinic radiation harden in the exposed image areas resulting in tacky and complementary nontacky image areas. The image areas which remain tacky can be developed by applying colored powders such as toners and pigments. A negative-working process is described in Cohen and Fan U.S. Pat. No. 4,174,216. Negative-working elements useful in the negative-working process comprise a support, a tacky, nonphotosensitive contiguous layer, a photohardenable photoadherent layer and a strippable cover sheet. After imagewise exposure to actinic radiation the cover sheet is peeled away together with the exposed areas of the photoadherent layer revealing the tacky contiguous layer beneath. The photoadherent layer in the unexposed image areas remains as a resist over the complementary portions of the contiguous layer. The tacky contiguous layer revealed in the exposed image areas is then toned with pigment. Layers toned with different pigments can be applied in registration over one another to form multilayer color proofs. Dependent on the thickness of the layers, the proof may exhibit a pronounced undesirable three-dimensional effect.

Many methods have been used to provide the positive-working materials and/or negative-working materials with matte finishes. Such methods include wet as well as dry systems, the latter being particularly desirable. Particulate materials of the oil-absorbing type have been applied to positive-working systems. In this instance, the degree of matte can be controlled to some extent by imaging through a halftone screen followed by applying the particulate material. This procedure is, however, not entirely effective in controlling the degree of matte over a wide range of gloss.

It is desired that a method be provided whereby the degree of matte of a tacky surface can be effectively controlled and the three-dimensional effect eliminated, when present, by a dry process which does not require a pre-exposure step, e.g., through a halftone screen, and can use a variety of particulate materials, not being restricted to the use of oil-absorbing particulate materials.

BRIEF DESCRIPTION OF THE FIGURE

In the accompanying FIGURE forming a part of this disclosure, the amount of gloss expressed in gloss units measured on the surfaces of the photopolymer proofs as described in Example 3 below is plotted when admixtures of particulate cellulose acetate ($\sim 5\mu$ average diameter) and Surlyn ® ionmer resin ($\sim 25\mu$ average diameter), containing cellulose acetate in the weight percent range of 0.1 to 50, are applied to said surfaces. The curve shows that the amount of gloss is generally reduced as the fraction of cellulose acetate in the admixture increases.

DISCLOSURE OF INVENTION

In accordance with this invention there is provided in a process for modifying a tacky surface by adhering particulate material thereto which comprises (1) applying the particulate material to said tacky surface, and (2) removing excess particulate material therefrom, the improvement wherein prior to application to the tacky surface the particulate material is admixed with carrier particles which are removed with the excess particulate material, the ratio of the average particle diameter of carrier particles to that of the particulate material in the mixture being greater than·2 and the weight ratio of particulate material to carrier particles being less than 1.

In practising the process of the invention many types of tacky surfaces can be modified by applying the admixture of particulate material and carrier particles. Tacky layers, for example, may be applied over painted surfaces which may have decorations present thereon; pictures, photographs and tacky photosensitive or nonphotosensitive layers, some types of which are illustrated in the examples below. When the surfaces are not tacky per se they may be made tacky by the application of adhesive materials, e.g., in spray or liquid form. Also useful for tacky layers are materials which have been temporarily plasticized, e.g., wet gelatin and wet polyvinyl alcohol, which are particularly useful on photographic prints. Specific glossy surfaces which are not tacky in their natural state and to which the tacky layers can be applied include metal, e.g., aluminum, steel, etc.; plastic, e.g., polyethylene terephthalate, polyvinyl acetate, polyamide, etc.; paper; wallboard; wood; etc.

Preferred surfaces to which the admixture of particulate material and carrier particles are applied are formed from positive-working photohardenable elements as described in U.S. Pat. No. 3,649,268 and negative-working photopolymer elements described in U.S. Pat. No. 4,174,216. These patents are incorporated by reference. The positive-working photohardenable elements comprise (1) a removable support, (2) a photohardenable or photopolymer layer containing at least one free radical initiated, chain propagating, addition polymerizable compound containing at least one terminal ethylenic group, and an addition polymerization initiator activatable by actinic radiation, and, optionally a compatible macromolecular organic polymeric binder, and (3) a strippable cover sheet. The negative-working elements comprise, in order from top to bottom, (1) a strippable cover sheet, (2) a photoadherent layer comprising a material with ethylenically unsaturated or benzophenone type groups, which is generally nontacky, (3) a tonable organic contiguous layer, e.g., a tacky, nonphotosensitive elastomeric layer which is tonable by application of particulate material, and optionally (4) a sheet support.

The positive-working and negative-working elements can be used to form surprint elements. Surprint elements are elements wherein at least two photosensitive elements that have been imaged and colored with different colorants (nonplanar, nonsilver halide colored, photoimaged elements) are sequentially laminated or bonded to a suitable support surface, e.g., paper, film, etc. In forming a surprint element, the cover sheet and any sheet support present in the photosensitive elements are removed. Generally a negative-working or positive-working photosensitive element is applied to the outermost colored photoimaged element of the surprint element. When the outer element of the surprint is a negative-working element, it is uniformly or nonimagewise exposed, the cover sheet present is removed together with the exposed adherent photosensitive layer, leaving a tacky, nonphotosensitive layer on the surprint. The tacky layer is then treated with particulate material according to the invention.

Generally, the surprint element has over its support four imaged colored photopolymer elements, e.g., yellow, magenta, cyan, black, and an optional fifth nonimaged photopolymer element. A multicolor surprint element prepared by the surprint method is described in U.S. Pat. Nos. 3,649,268 and 4,174,216. Colorants and toners used in preparing the surprints are described in U.S. Pat. Nos. 3,620,726, 3,909,326 and Manger et al. application Ser. No. 091,889, filed Nov. 7, 1979 now U.S. Pat. No. 4,286,046 dated Aug. 25, 1981, which are incorporated by reference.

The carrier particles are generally transparent or translucent, inert, i.e., nonelectroscopic, spheroidal-shaped solid polymer particles with an average diameter of from about 10 to 100$\mu$. The particle size can be measured, for example, by a Coulter Counter, Coulter Electronics, Inc., Hialeah, Fla. The selection of the size of the carrier particles is determined by certain factors. For example, the carrier particles must be large enough to be readily removed from the tacky surface to which they are applied. Conversely, the carrier particles must be small enough so that, together with attached particulate material, the inert carrier particles can be uniformly wiped over the tacky surface. Useful carrier particles include: polymethylmethacrylate, polyethylemethacrylate, polyethylene, polyvinyl chloride, polyvinyl acetate, polystyrene, polyvinyl alcohol, cellulose acetate, and preferably ionic copolymer of $\alpha$-olefins having the formula R-CH=CH$_2$ where R is a radical selected from the class consisting of hydrogen, alkyl of 1 to 8 carbon atoms and $\alpha,\beta$-ethylenically unsaturated carboxylic acid having from 3 to 8 carbon atoms, the copolymers having from 10% to 90% of the carboxylic acid groups ionized by neutralization with metal ions uniformly distributed throughout the copolymer.

Admixed with the carrier particles are particulate materials having an average diameter of from 1$\mu$ to 20$\mu$, the ratio of the average diameter of the carrier particles to that of the particulate material being greater than 2 to 1. The size of these particles can also be measured by a Coulter Counter. A useful range of average diameter carrier particles to particulate material is between 2:1 to 30:1. The amount by weight of particulate material in the admixture is also important. The weight ratio of particulate material to carrier particles is less than 1:1. A percent range is between about 0.1 to 50% by weight particulate material to 50 to 99.9% by weight carrier particles. As the ratio of particulate material to carrier particles changes, the degree of matte is altered as noted below. Useful substantially colorless particulate materials, alone or in combination, include: cellulose acetate, polyvinyl alcohol, polyethylene resins, waxes, diatomaceous silica, starches, e.g., rice and corn; talc, etc.; and colored pigments or toners such as those described in U.S. Pat. Nos. 3,620,726; 3,909,326 and Manger et al. application Ser. No. 091,889, filed Nov. 7, 1979 now U.S. Pat. No. 4,286,046 dated Aug. 25, 1981, which are incorporated by reference, in combination with the substantially colorless particulate materials. The pigments can be present in an amount 0 to 20% by weight based on the weight of admixture to tint the tacky surface. While, surprisingly, the particulate material and carrier particles can be similar in composition, the ratios of average diameter and weight set forth above must be observed.

In practicing the process of this invention, a carrier particle of average diameter suitable for the tacky surface which is to be modified is selected and is mixed with a pre-determined amount of particulate material. The amount of gloss can be determined for various admixtures of particulate material and carrier particles. Referring to the drawing, various percentage amounts of cellulose acetate particulate material ($\sim$5$\mu$ average diameter) and Surlyn® A ionomer resin ($\sim$25$\mu$ average diameter) are applied to the surface of a layer of photopolymer present on a four-color proof prepared as described in Example 1 below. The admixture can be applied to the tacky surface by use of a fiber pad dipped into the admixture and wiped over the tacky surface or by an applicator such as described in Sandner U.S. Pat. No. 4,019,821, incorporated by reference. The "glossiness" of the treated surface is plotted in gloss units determined by means of a Photoelectric Glossmeter, Model 610, Photovolt Corp., 1115 Broadway, New York, N.Y. As illustrated in the drawing high gloss (no matte) is achieved with substantially no particulate cellulose acetate present. The lowest amount of gloss (high matte) is achieved at a level of less than 50% by weight particulate cellulose acetate in the admixture. By selecting an amount of particulate cellulose acetate in the admixture intermediate between the aforementioned amounts, the operator can modify the tacky surface to any degree of matte that is desired. Optionally prior to the application of the admixture to the tacky surface, the photopolymer surface can be exposed through a halftone screen tint, for example, as described in Romano U.S. application Ser. No. 189,828 entitled "Process for Surface Improvement of Surprint Proof", filed Sept. 23, 1980. The exposure and the screen can be varied to adjust the polymerization of the surface and consequently the level of matte. Not only can the tacky surface be given a matte finish, but the surface can also be tinted by adding to the admixture a small amount of a particulate colored pigment or toner as described above. Generally in tinting the components of the admixture other than the pigment or toner are colorless or translucent. Subsequent to the application of the admixture to the tacky photopolymer surface the surface may be exposed to actinic radiation to harden the surface.

Best Mode for Carrying Out the Invention

The best mode is illustrated in Example 2 wherein a four-color negative color proof having a fifth, clear photopolymer layer laminated thereover is treated with an admixture of 10% by weight cellulose acetate ($\sim$5$\mu$ average diameter) and 90% by weight ionic copolymer (~25μ average diameter) to achieve a nonglossy matte finish free from three-dimensional effects and useful as a surprint proof which simulates a press proof.

Industrial Applicability

The process of the invention is useful in modifying the glossiness of a variety of tacky surfaces. The tacky surfaces may be otherwise nontacky, nonphotosensitive one such as painted or decorated walls or surfaces of metal or plastic, plastic film materials, etc. to which a tacky material has been applied; or tacky nonphotosensitive layers such as tacky, elastomeric surfaces, or photosensitive layers such as photopolymer layers. The process is particularly useful in modifying the tacky surfaces of color proofs of the negative- or positive-working types. The treated surface of the color proof has a matte finish which is free from undesirable three-dimensional effects. The color proof containing the matte-finish, the degree of which can be controlled by the process, is suitable as a surprint proof to simulate a press proof.

EXAMPLES

The following examples illustrate the invention wherein the parts and percentages are by weight.

EXAMPLE 1

A photopolymerizable composition is prepared by mixing together the following ingredients:

| Ingredient | Amount (parts) |
| --- | --- |
| Polymethylmethacrylate, molecular weight ~ 30,000, density 1.13 g/cc | 32.40 |
| Trimethylolpropane trimethacrylate | 35.60 |
| 2-o-Chlorophenyl-4,5-bis-(m-methoxyphenyl) imidazolyl dimer | 1.58 |
| 2-Mercaptobenzothiazole | 0.79 |
| Polyoxyethylene lauryl ether | 7.90 |

The mixture is dissolved in methylene chloride (20% solution) and is coated onto a 0.001 inch (0.0025 cm) thick polyethylene terephthalate support and a 0.001 inch (0.0025 cm) thick cover sheet of polypropylene is laminated onto the coating at room temperature. The cover sheet is removed at room temperature with substantially no effect on the photopolymerizable layer, and the layer is laminated at about 110° C. to the smooth side of Kromekote ® cast-coated one-side paper, manufactured by Champion Paper and Fiber Company on a fixed-bed transfer machine as described in Chu et al. U.S Pat. No. 3,594,535, incorporated by reference. The photopolymer layer is exposed at a distance of about 27 inches (68.6 cm) through a minus-blue separation halftone positive for about 8 seconds using a nuArc ® Plate Maker "Flip Top", Model FT26M-2 carbon arc light source. The polyethylene terephthalate support is removed at room temperature and Dalamar ® yellow toner (Pigment yellow 74 C.I. #11741) prepared according to Example 9 of Manger et al., U.S. Pat. No. 4,215,193 is applied to the photopolymer surface. Excess toner is removed with a cotton pad. The toner adheres only to those areas that were not exposed to the radiation.

The cover sheet is removed from a second element coated with the above-described composition, and the clear photopolymer layer is laminated onto the yellow-toned layer, obtained above, at a temperature of 110° C.

The two-layer film base is exposed through a minus-green separation halftone positive for 3 seconds using the nuArc ® light source. The base support is stripped from the photopolymer, and a magenta toner, a dispersion consisting of 50 percent mixture of quinacridone magenta, Quindo Magenta (C.I. Pigment Red 122) and Indo Brilliant Scarlett toner (Pigment Red 123, C.I. #71145) and 50 percent cellulose acetate, prepared as described in Example 11 of U.S. Pat. No. 4,215,193, is applied to the exposed surface at room temperature. The excess toner is dusted off with a cotton pad, the pigment adhering to the underexposed areas only.

The cover sheet is removed from a third photopolymerizable element coated with the above-described composition and the clear photopolymer layer is laminated onto the magenta-toned layer, obtained above, at a temperature of 110° C. This is exposed through the minus-red halftone positive for 3 seconds using the nuArc ® light source. The polyethylene terephthalate support is removed from the layer, and a phthalocyanine cyan toner, a dispersion of 50 percent mixture of Monastral ® Blue G (Copper Phthalocyanine Pigment Blue 15, C.I. #74160) and Monastral ® Green G (Pigment Green 7, C.I. #74260) and 50 percent cellulose acetate prepared as described in Example 1 of U.S. Pat. No. 4,215,193 is dusted onto the exposed surface at room temperature. The excess toner is removed with a cotton pad, leaving pigment in the underexposed areas only.

A fourth photopolymerizable layer is laminated onto the cyan-toned layer of the three-layer film base using the same procedure and under the same conditions used in preparing the two previous layers. The fourth layer is exposed through a black printer halftone positive for 3 seconds using the nuArc ® light source. After stripping off the polyethylene terephthalate support, a carbon black toner, Carbon Black, Sterling ® NS N774 (C.I. Pigment Black 7, C.I. #77266) prepared as described in Example 10 of U.S. Pat. No. 4,215,193, predispersed in pentaerythritol resin is applied to the exposed surface at room temperature. The excess pigment is dusted off with a cotton pad, leaving pigment in the underexposed areas only.

After application of the black toner to the photopolymerizable layer, a fifth layer of photopolymer is laminated at 110° C. over the four-color halftone positive which exhibits a slight three-dimensional effect. The polyethylene terephthalate support is removed after the lamination. A mixture of particulate cellulose acetate (1 g, about 5μ average diameter) and Surlyn ® A ionomer resin beads manufactured by E. I. du Pont de Nemours and Company, Wilmington, Delaware (20 g, about 25μ average diameter) is applied by means of a fiber pad dipped into the admixture to the unexposed tacky photopolymer surface, and the surface is wiped with a cotton cloth to remove excess cellulose acetate and all the carrier particles. The four-color proof has a uniform matte appearance, a hard dry surface and simulates closely a press proof.

EXAMPLE 2

A negative-working pre-press color proof of the surprint type is prepared as follows:

I. Nontonable Photopolymerizable Layer

A coating solution of a photopolymerizable composition is prepared by mixing together the following ingredients:

| Ingredient | Weight (g) |
| --- | --- |
| Polymethyl methacrylate (MW 200,000–300,000) | 41.54 |
| Di-(3-acryloxy-2-hydroxypropyl) ether of Bisphenol-A | 51.86 |
| (2-Chlorophenyl-4,5-diphenyl imidazolyl) dimer | 2.20 |
| 2-(Stilbyl-4'')-(naptho-1',2';4,5) 1,2,3-triazol-2''-sulfonic acid phenyl ester | 2.20 |
| 2-Mercaptobenzoxazole | 1.50 |
| Polyethylene oxide (MW 600,000) | 0.70 |
| Methanol | 20.70 |
| Methylene chloride | 323.70 |

This solution is coated at a coating weight of about 40 mg/dm$^2$ when dried on a clear polyethylene terephthalate film having a thickness of 0.0005 inch (0.0015 cm) which is surface treated by electrostatic discharge at 0.07 coulombs/ft$^2$ (0.093 coulombs/m$^2$).

II. Tonable, Tacky Elastomer Contiguous Layer

A coating solution is prepared by mixing together the following ingredients:

| Ingredient | Weight (g) |
| --- | --- |
| Random copolymer of styrene/butadiene (40/60) | 19.75 |
| Cis-polybutadiene (Mooney Viscosity 55–60) | 79.75 |
| Tetra-bis-[methylene 3-(3',5'-di-t-butyl-4'-hydroxyphenyl) proprionate] methane | 0.50 |
| Methylene chloride to make | 1333.30 |

This solution is coated on polyethylene terephthalate film having a releasable layer of polydimethyl siloxane coated thereon to give a coating weight of about 125 mg/dm$^2$ when dried.

III. Laminating Procedure

The supported photopolymerizable layer (I) and the supported tonable, tacky elastomer contiguous layer (II) are laminated in surface-to-surface relationship at room temperature with a pressure of about 40 psi (2.81 kg/dm$^2$).

IV. Operations for Preparation of a Surprint

The laminate (III) is further handled as follows:

The polyethylene terephthalate film with the siloxane release coating is stripped from the tonable, tacky layer and the resulting element is then laminated at 100° C. to a 0.012 inch (0.03 cm) thick paper support (identified as Baryta ® Paper, marketed by the Intermill Corporation, Belgium). The element is then exposed to a halftone negative, minus-blue, color separation film record, the exposure being made through the electrostatic discharge treated, clear polyethylene terephthalate film. This exposure is about 30 seconds on an exposing device identified as a Berkey-Ascor Vacuum Printer, fitted with a photopolymer lamp (2 KW) and a Kokomo ® glass filter (No. 400) Kokomo Opalescent Glass Co., Kokomo, IN. The distance between the lamp and the vacuum frame of this device is about 38 inches (96.52 cm). After the exposure is made, the exposed element is taped securely to a suitable flat surface, and the clear polyethylene terephthalate film cover sheet is stripped by pulling at one corner with an even, continuous motion at an angle of about 135°–180°. The resulting exposed, photopolymerized image photoadheres to the electrostatic discharge treated film and is removed with the film thus exposing equivalent areas of the tacky, elastomer contiguous layer on the paper support. The bared areas of the contiguous layer are toned using a yellow toner, Dalamar ® Yellow (Pigment Yellow 74, C.I. No. 11741). A second laminate (III) having its polyethylene terephthalate film with release coating removed as described above is laminated to the surface of the yellow image and is exposed to a halftone, negative, minus-green color separation film record in registration. The clear, surface treated polyethylene terephthalate film of the second laminate is stripped from the contiguous layer leaving bared an image which is toned with a magenta toner as described above. The process is then repeated for the minus-red (cyan toner) and black negative records. The toners used are described in Example 1 above. This procedure yields a four-color negative surprint proof.

Conventionally the surprint proof is finished by laminating an additional laminate (III) as described above having its polyethylene terephthalate film with release coating stripped therefrom to the outer surface of the four-color proof. The composite element is given an overall exposure with the clear polyethylene terephthalate film cover sheet in place to harden the photopolymerizable layer. The laminate (III) serves to transparentize the upper toned layer of the composite element and by exposure with the cover sheet in place also serves to protect the surprint proof. The image, when viewed through the glossy polyethylene terephthalate film has a high gloss, a three-dimensional effect and the image is not as sharp as a press sheet.

In place of laminate (III), onto the outer surface of the four-color proof is laminated at 110° C. a positive-working photopolymer layer similar to the fifth layer of photopolymer described in Example 1. An admixture of particulate cellulose acetate (2.0 g, about 5μ average diameter) and Surlyn ® A ionomer resin beads (carrier particles) described in Example 1 (20 g, about 25μ average diameter) is applied to the unexposed tacky photopolymer after removal of the polyethylene terephthalate film. After removal of the excess particulate cellulose acetate and carrier particles as described in Example 1, the four-color proof has a uniform matte finish which is clean, dry and resembles a press sheet. The three-dimensional effect is eliminated.

EXAMPLE 3

Eleven (11) four-color positive proofs are prepared as described in Example 1. Each proof has a fifth layer of the unexposed photopolymer laminated over the four-color image as described in Example 1. Various admixtures of the carrier particles (about 25μ average diameter) and particulate cellulose acetate (about 5μ average diameter) as described below are applied to the tacky photopolymer surface of the proof. The gloss is read using a photoelectric Glossmeter, Model 610, Photovolt Corp., 1115 Broadway, New York, NY 10010, with the following results:

| Sample | Cellulose Acetate in Admixture (%) | Gloss Units (Avg. 3 runs) |
| --- | --- | --- |
| 1 (control) | none | 96 |
| 2 | 0.1 | 81 |
| 3 | 1.7 | 74 |
| 4 | 2.5 | 67 |
| 5 | 5.0 | 46 |
| 6 | 7.5 | 36 |
| 7 | 10.0 | 55 |
| 8 | 20.0 | 42 |
| 9 | 25.0 | 47 |
| 10 | 30.0 | 39 |
| 11 | 50.0 | 32 |

The results are plotted and the curve is shown in the drawing forming a part of this disclosure. This example shows that the degree of matte can be controlled by the addition to the tacky photopolymer surface of the four-color proof of various concentration particulate material/carrier particle admixture.

EXAMPLE 4

Three (3) four-color proofs containing a fifth layer of unexposed photopolymer are prepared as described in Example 1. After removal of the polyethylene terephthalate film, to the tacky photopolymer surface is applied an admixture of polyethylene carrier particles (about 14μ average diameter) and particulate cellulose acetate (about 5μ average diameter). Each sample is examined on the glossmeter described in Example 3 with the following results:

| Sample | Cellulose Acetate in Admixture (%) | Gloss Units |
| --- | --- | --- |
| 1 (control) | none | 84 |
| 2 | 1.0 | 48 |
| 3 | 10.0 | 28 |

This example illustrates the use of polyethylene as carrier particles in combination with particulate cellulose acetate to control modification of a tacky surface.

EXAMPLE 5

Two positive four-color proofs are prepared as described in Example 1 and two negative four-color proofs are prepared as described in Example 2. A fifth layer of unexposed photopolymer (Ex. 1) is applied to each of these proofs, and the polyethylene terephthalate film is removed as described in Example 1. To the tacky surface of each sample is applied as described in Example 1 an admixture of polyvinyl alcohol (PVA) carrier particles (about 32μ average diameter) and particulate cellulose acetate (about 5μ average diameter). Each sample is examined on the glossmeter described in Example 3 with the following results.

| Sample | Cellulose Acetate in Admixture (%) | Gloss Units |
| --- | --- | --- |
| Positive (control) | none | 75 |
| Positive | 10.0 | 21 |
| Negative (Control) | none | 83 |
| Negative | 10.0 | 15 |

This example illustrates the use of different carrier particles to modify a tacky photopolymer surface over positive-working and negative-working photopolymer four-color proofs.

EXAMPLES 6 AND 7

Example 5 is repeated using two additional admixtures containing carrier particles and particulate material. The admixtures are as follows:

| Example | Carrier Particles (Average diameter) | Particulate Material (Avg diameter) |
| --- | --- | --- |
| 6 | Cellulose Acetate (~27μ) | Cellulose Acetate (~5μ) |
| 7 | Surlyn ®A Ionomer Resin (See Example 1) (~25μ) | Diatomaceous Silica (~5μ) |

About 10 percent of particulate cellulose acetate is present in the admixture of Example 6 and about 10 percent of particulate diatomaceous silica is present in the admixture of Example 7. Each of the admixtures is applied to the tacky surface present on a positive-working color proof and a negative-working color proof. The surfaces of the proofs have a matte finish which closely resembles and matches a press sheet.

EXAMPLES 8 TO 13

The following carrier particles/particulate material admixtures are applied to the tacky photopolymer layer over a four-color proof prepared as described in Example 1.

| Example | Carrier Particles (Average diameter) | Particulate Material (Avg diameter) |
| --- | --- | --- |
| 8 | Surlyn ®A Ionomer Resin (25μ) | Diatomaceous Silica (12μ) |
| 9 | Surlyn ®A Ionomer Resin (27μ) | Rice Starch (14μ) |
| 10 | Polymethylmethacrylate (>55μ) | Cellulose Acetate (5μ) |
| 11 | Surlyn ®A Ionomer Resin (25μ) | Polyethylene wax (7μ) |
| 12 | Surlyn ®A Ionomer Resin (25μ) | Talcum Powder (6.7μ) |
| 13 | Surlyn ®A Ionomer Resin (25μ) | Corn Starch (12μ) |

The surfaces of the four-color proofs have good matte finishes which match a press sheet.

EXAMPLE 14

A four-color proof is made according to Example 2 over the tacky outer photopolymer layer is applied an admixture of particulate cellulose acetate (0.9 g, about 5μ average diameter) diluted with yellow toner described in Example 1 (0.1 g, about 2μ average diameter) and Surlyn ® A ionomer resin (10 g, about 25μ average diameter). The admixture contains 99% cellulose acetate and 1% yellow toner. The modified element has a slight yellow tint. The tinting step may be necessary to match certain papers, for example, during the press-proof matching step.

EXAMPLES 15 AND 16

Two four-color proofs are made, one according to Example 1 (positive-working) and one according to Example 2 (negative-working). An additional laminate (III) from Example 2 is laminated to elements as described in Example 2 and is given an overall exposure in order to harden the nontonable photopolymer layer (I) which is then removed with the cover sheet exposing the tonable, tacky elastomer contiguous layer (II) over the four-color proof. A mixture of particulate cellulose acetate (1 g, about 5μ average diameter) and Surlyn ® A ionomer resin beads (20 g, about 25μ average diameter) is applied to the tonable, tacky layer as described in Example 1. Control positive and negative color proofs are prepared which contain the tacky layer without addition of particulate material and carrier particles to the surface. The following results are achieved.

| Example | Gloss Units | Appearance |
| --- | --- | --- |
| 15 (positive) | 62 | Smooth; good matte |
| 16 (negative) | 55 | Smooth; good matte |
| Control (positive) | 78 | Tacky; no matte |
| Control (negative) | 86 | Tacky; no matte |

This example demonstrates the modification of a non-photosensitive but tacky surface.

EXAMPLE 17

A sample of aluminum foil, No. 672, Reynolds Metal Co., Richmond, Va. is coated with rubber cement (Best-Test ® Paper Cement, Union Rubber, Inc., Trenton, N.J.) using a 2.0 (~0.005 cm) doctor knife. While the layer is still tacky, the mixture of cellulose acetate and Surlyn ® ionomer resin beads described in Example 1 is applied thereto with the following results:

| | Gloss Units | |
| --- | --- | --- |
| Foil Uncoated | Coated | Coated and Treated |
| 100 | 90 | 55 |

The surface of the coated and treated aluminum foil is smooth and uniform with a pleasing matte finish and no evidence of carrier particle pickup.

EXAMPLE 18

A sample of uncoated, clear 0.007 inch (0.0178 cm) thick polyethylene terephthalate film is coated with a 10% aqueous solution of polyvinyl alcohol using a 2.0 mil (~0.005 cm) doctor knife. While this layer is still tacky, the mixture of cellulose acetate and Surlyn ® ionomer resin beads described in Example 1 is applied thereto. The clear, tacky layer turns milky white, and the gloss level is reduced from 96 units to 58 units.

This example, as well as Example 17, demonstrates the use of the process of this invention to modify surfaces containing tacky coatings thereon.

EXAMPLE 19

Two, four-color proofs are prepared and a fifth layer of unexposed photopolymer laminated thereover as described in Example 1. After removal of the cover sheet one sample is treated with polyvinyl chloride (PVC) beads (Geon ® 99, General Electric Co., average diameter greater than 80μ), and the second sample is treated with a mixture of cellulose acetate (1 g, about 5μ average diameter) and similar polyvinyl chloride beads (20 g) as described above. The following results are obtained.

| Sample | Gloss Units | Appearance |
| --- | --- | --- |
| PVC | 83 | Clear-tacky |
| Cellulose acetate/PVC | 58 | Smooth, uniform, matte, dry |

Controls A and B

Three samples of positive-working four-color proofs are prepared having a tacky outer photopolymer layer as described in Example 1. To the tacky surface of each sample is applied as described in Example 1 an admixture of carrier particles and particulate material as follows:

| Control | Carrier Particles (Average diameter) | Particulate Material (Avg diameter) |
| --- | --- | --- |
| A | Surlyn ®A Ionomer Resin (25μ) | Polyvinyl Alcohol (32μ) |
| B | Cellulose Acetate (27μ) | Surlyn ®A Ionomer Resin (25μ) |

The percent of particulate material present in the admixture of the listed controls is ten. Each sample exhibits high gloss, in the range of 95 gloss units, indicating that substantially no particulate material adheres to the tacky photopolymer surface after wiping with a cotton cloth. These controls illustrate the criticality of the ratio of the average particle diameter of the carrier particles to particulate material.

Controls C to H

Six four-color proofs are made according to Example 1 and a fifth layer of unexposed photopolymer made according to Example 1 is laminated thereon. Various mixtures (C to H) of polyethylene beads (about 14μ average diameter) and rice starch (about 14μ average diameter) are applied to the tacky surfaces. The following results are obtained:

| Control | Rice Starch (%) | Gloss Units | Appearance |
| --- | --- | --- | --- |
| C | 0 | 35 | poor |
| D | 10 | 25 | poor |
| E | 25 | 28 | poor |
| F | 50 | 31 | poor |
| G | 75 | 34 | poor |
| H | 100 | 41 | poor |

These controls illustrate the criticality of the ratio of the carrier particles to particulate material.

We claim:

1. In a process for modifying a tacky surface by adhering particulate material thereto which comprises
(1) applying the particulate material to said tacky surface, and
(2) removing excess particulate material therefrom, the improvement wherein prior to application to the tacky surface the particulate material is admixed with carrier particles which are removed with the excess particulate material, the ratio in the mixture of the average particle diameter of carrier particles to that of the particulate material in the mixture being greater than 2 and the weight ratio of particulate material to carrier particles being less than 1.

2. A process according to claim 1 wherein the tacky surface is a tacky adhesive layer.

3. A process according to claim 1 wherein the particulate material is cellulose acetate.

4. A process according to claim 1 wherein the carrier particles are an ionic copolymer.

5. A process according to claim 3 wherein the carrier particles are an ionic copolymer.

6. A process according to claim 1 wherein the admixture of the particulate material and carrier particles contains particulate pigment material.

7. A process for modifying a tacky surface of a surprint multicolor proof having at least two nonplanar nonsilver halide colored photoimaged elements sequentially bonded to a support, and a tacky layer present as the outer layer of the proof which comprises
(1) applying particulate material to the tacky surface, and
(2) removing excess particulate material therefrom,
wherein prior to application to the tacky surface the particulate material is admixed with carrier particles which are removed with the excess particulate material, the ratio in the mixture of the average particle diameter of carrier particles to that of the particulate material in the mixture being greater than 2 and the weight ratio of particulate material to carrier particles being less than 1.

8. A process according to claim 7 wherein the photoimaged elements, prior to exposure, comprise a photoadherent layer comprising a nontacky photohardenable material with ethylenically unsaturated or benzophenone type groups and a contiguous layer of a nonphotosensitive, tacky organic material.

9. A process according to claim 8 wherein the tacky layer present as the outer layer of the proof is formed by laminating to the outer nonplanar nonsilver halide colored photoimaged element a photohardenable element comprising a contiguous layer of a nonphotosensitive, tacky organic material, a photoadherent layer of a nontacky photohardenable material with ethylenically unsaturated or benzophenone type groups, and a removable cover sheet; exposing the element nonimagewise through the cover sheet to harden the photohardenable layer; and removing the cover sheet with the exposed photoadherent layer.

10. A process according to claim 9 wherein each colored photoimaged element has been exposed through a different color separation negative and the respective photoadherent layers have been colored in a spectral region corresponding to the color separation negative used for the exposure.

11. A process according to claim 10 wherein four photoimaged elements are present in the surprint multicolor proof and the elements and colored separation negatives correspond, respectively, to yellow, magenta, cyan and black.

12. A process according to claim 7 wherein the tacky layer present as the outer layer is a photopolymeizable layer.

13. In a process for modifying an imagewise exposed and developed photosensitive material bearing a tacky surface by adhering particulate material thereto which comprises
(1) applying the particulate material to said tacky surface, and
(2) removing excess particulate material therefrom,
the improvement wherein prior to application to the tacky surface the particulate material is admixed with carrier particles which are removed with the excess particulate material, the ratio in the mixture of the average particle diameter of carrier particles to that of the particulate material in the mixture being greater than 2 and the weight ratio of particulate material to carrier particles being less than 1.

14. A process according to claim 13 wherein the tacky surface is present in a photopolymerizable layer.

15. A process according to claim 13 wherein the tacky surface is present in an element containing nontonable image areas and tacky nonphotosensitive image areas.

16. A process according to claim 14 wherein subsequent to application of the admixture to the tacky photopolymer surface the surface is nonimagewise exposed to actinic radiation.

17. A process according to claim 13 wherein the particulate material is cellulose acetate.

18. A process according to claim 13 wherein the carrier particles are an ionic copolymer.

19. A process according to claim 17 wherein the carrier particles are an ionic copolymer.

20. A process according to claim 13 wherein the admixture of particulate material and carrier particles contains particulate pigment material.

* * * * *